United States Patent
Lee

(10) Patent No.: US 7,407,884 B2
(45) Date of Patent: Aug. 5, 2008

(54) METHOD FOR FORMING AN ALUMINUM CONTACT

(75) Inventor: Jae-Suk Lee, Suwon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 301 days.

(21) Appl. No.: 11/319,546

(22) Filed: Dec. 29, 2005

(65) Prior Publication Data

US 2006/0141779 A1    Jun. 29, 2006

(30) Foreign Application Priority Data

Dec. 29, 2004   (KR) .................. 10-2004-0115518

(51) Int. Cl.
*H01L 21/4763*   (2006.01)

(52) U.S. Cl. ............... 438/653; 438/659; 438/663; 438/675; 438/668; 257/E21.586

(58) Field of Classification Search ............. 438/659
See application file for complete search history.

(56) References Cited

U.S. PATENT DOCUMENTS

| | | | | | |
|---|---|---|---|---|---|
| 5,098,884 | A | * | 3/1992 | Yamazaki | 505/471 |
| 5,300,462 | A | * | 4/1994 | Kakumu | 438/659 |
| 5,654,239 | A | * | 8/1997 | Sakamoto | 438/491 |
| 5,665,995 | A | * | 9/1997 | Hsue et al. | 257/390 |
| 5,880,023 | A | * | 3/1999 | Jun | 438/652 |
| 6,426,289 | B1 | * | 7/2002 | Farrar | 438/670 |
| 6,500,749 | B1 | * | 12/2002 | Liu et al. | 438/618 |

* cited by examiner

*Primary Examiner*—Stephen W Smoot
(74) *Attorney, Agent, or Firm*—Lowe Hauptman Ham & Berner LLP

(57) ABSTRACT

A method of forming an aluminum contact including forming a barrier metal layer on an interlayer insulation layer pattern defining a contact hole, and forming an aluminum layer on the barrier metal layer so as to fill the contact hole. The method further includes forming a photoresist pattern for ion implantation, implanting ions into the aluminum layer, and annealing by using a rapid thermal process.

4 Claims, 3 Drawing Sheets

METHOD FOR FORMING AN ALUMINUM CONTACT

CROSS-REFERENCE TO RELATED APPLICATION

This application claims priority to and the benefit of Korean Patent Application No. 10-2004-0115518 filed in the Korean Intellectual Property Office on Dec. 29, 2004, the entire contents of which are incorporated herein by reference.

BACKGROUND OF THE INVENTION (a) Field of the Invention

The present invention relates to a method of manufacturing semiconductor devices. More particularly, the present invention relates to a method for forming an aluminum contact in a semiconductor device.

(b) Description of the Related Art

As semiconductor devices have been more highly integrated, width and thickness of metal lines therein have been reduced, and size of a contact has been reduced. Therefore, an aspect ratio of a contact hole has been increased, and thus a method for fully filling the contact hole has become very important.

For a method for fully filling the contact hole having a high aspect ratio with a low resistivity material, an aluminum layer may be deposited by a chemical vapor deposition (CVD) process, so-called Al-CVD.

The Al-CVD process is classified as a blanket deposition process or a selective deposition process. The blanket deposition process is a method of filling a contact hole by depositing an aluminum film on an entire surface of a wafer. This process is for making the best of a good step-coverage of the aluminum film. However, the blanket deposition process of Al-CVD may have an abnormal growth characteristic in a thick aluminum film. Consequently, the film may have a rough surface and may fail to fill a small contact due to blocking of an inlet portion.

On the other hand, the selective deposition process is a method for making use of a difference of a growth rate depending on a substrate (e.g., an insulation layer or a conductive layer) whereon the deposition is performed. This process can be used for a limited region such as a via contact, but it has a difficulty in forming a metal contact wherein a barrier metal is pre-deposited.

Japanese Patent Publication No. 1992-171940 describes a manufacturing method of a semiconductor device including steps of forming conductive layers having an ohmic conductive layer and a barrier conductive layer and a aluminum layer (or aluminum alloy layer) in a contact hole, leaving the aluminum layer in a sidewall of the contact hole, leaving the barrier conductive layer on the bottom of the contact hole, reflowing the aluminum layer in a sidewall of the contact hole, and forming an additional aluminum layer to fill the contact hole. Additionally, U.S. Pat. No. 6,022,800 describes a method of filling a contact hole including steps of forming a first TiN layer on an entire surface of a contact hole by a CVD method, forming a second TiN layer thereon by a physical vapor deposition (PVD), and forming a tungsten layer so as to fill the contact hole. Furthermore, Japanese Patent Publication No. 1998-64902 describes a method of a filling a contact hole including steps of forming a barrier layer of Ti and TiN by a PVD method, forming a Ti layer on the barrier layer, forming an aluminum layer at room temperature, and reflowing the aluminum layer by a thermal process.

As the line width in a circuit becomes narrower, conventional deposition methods for aluminum wiring in a semiconductor device face limitations. Accordingly, a method for filling a contact hole (a contact between a lower conductive layer and an upper aluminum line) or a via hole (a contact between a lower aluminum line and an upper aluminum line) has become a critical technology for an electrical interconnection.

In filling the contact hole or via hole (referred to as only "contact hole" hereinafter) with aluminum, various process methods have been developed so as to have better electrical characteristics and better filling characteristics. In manufacturing a next generation memory device, the contact hole has a high aspect ratio, so a PVD method (i.e., a sputtering method) becomes insufficient for a deposition process for forming a metal layer having a line width of under 0.25 μm. Therefore, various types of research are under investigation for forming an aluminum layer using a CVD method having a better step coverage characteristic than the PVD method. Particularly, a process is under investigation wherein an aluminum thin film is selectively formed in a contact hole by a CVD method and an additional aluminum layer is deposited on an exterior part of the contact hole.

FIG. 1A and FIG. 1B are cross-sectional views showing principal stages of forming an aluminum contact according to a conventional method.

First, as shown in FIG. 1A, an active region is defined on a silicon wafer 101 by a field oxide layer (not shown). The field oxide layer is formed by using a local oxidation of silicon (LOCOS) process or a trench process. A gate oxide layer 104 is formed on the silicon wafer 101 by a thermal oxidation process. Subsequently, a polysilicon layer 106 to be used as a gate electrode is formed on the gate oxide layer 104, and the polysilicon 106 and the gate oxide layer 104 are patterned to a predetermined width.

Then, a lightly doped drain (LDD) 103 is formed in an active region on the silicon wafer 101 by implanting P-type or N-type dopants having a low concentration thereinto by using the gate electrode 106 as an implantation mask. After a liner layer 107 and a sidewall 105 is sequentially formed on both side of the gate stack including the oxide layer 104 and the gate electrode 106, a source/drain 102 is formed in an active region on the silicon wafer 101 by implanting the same type of dopants as the LDD 103 thereinto by using the sidewall 105 and gate electrode 106 as an implantation mask.

Subsequently, after a capping oxide layer 108 is formed on the upper surface of the substrate, a pre-metal dielectric (PMD) layer 109 composed of ozone-TEOS or high density plasma phosphosilicate glass (HDP-PSG) is thickly formed by an atmospheric pressure CVD (APCVD) method. After a heat treatment process for improving the hardness of the PMD layer 109, the upper surface of the PMD layer is planarized by chemical mechanical polishing (CMP). Then, a capping oxide layer 110 is formed on the PMD layer 109.

After a photosensitive layer pattern (not shown) for patterning a contact hole is formed on the capping oxide layer 110, as shown in FIG. 1B, the contact hole is formed by etching the exposed capping oxide layer 110 by using the photosensitive layer pattern as a etching mask. The contact hole is filled by depositing a TiN layer 111 as a barrier metal layer on the entire surface over the silicon wafer 101 and subsequently forming a tungsten layer 112.

A tungsten layer formed by a CVD method has relatively low resistivity. In addition, tungsten is a heavy metal having high immunity against electron migration and stress migration, and thus the tungsten layer may be free from voids or hillocks that may cause a junction breakdown. However, as the integration of semiconductor devices become higher, a metal having a low resistivity is highly required. Aluminum having a low resistivity has a difficulty in suppressing a hillock, and thus junction breakdown may occur.

The above information disclosed in this Background section is only for enhancement of understanding of the background of the invention and therefore it may contain information that does not form a part of the prior art with respect to the present invention.

SUMMARY OF THE INVENTION

The present invention has been made in an effort to provide a method for forming an aluminum contact having advantages of preventing a junction breakdown by suppressing hillock formation caused by stress in an aluminum layer.

An exemplary method for forming an aluminum contact according to an embodiment of the present invention includes forming a barrier metal layer on an interlayer insulation layer pattern defining a contact hole, forming an aluminum layer on the barrier metal layer so as to fill the contact hole, forming a photoresist pattern for ion implantation, implanting ions into the aluminum layer, and annealing by using a rapid thermal process.

In a further embodiment, the barrier metal layer can be composed of titanium nitride (TiN), tantalum nitride (TaN), titanium aluminum nitride (TiAlN), titanium silicon nitride (TiSiN), tantalum aluminum nitride (TaAlN), tantalum silicon nitride (TaSiN), tungsten nitride (WN), or a combination thereof.

The aluminum layer can be deposited by a chemical vapor deposition (CVD) method.

The ions implanted into the aluminum layer are Bi, Pb, Pt, Re, Os, Ir, or Tl ions.

The exemplary embodiment of the present invention includes forming a barrier metal layer, forming an aluminum layer having low resistivity by using a CVD method, implanting ions (e.g., Bi ions) that are heavier than tungsten, and annealing by using a rapid thermal process. Consequently, a junction breakdown can be prevented by suppressing hillock formation caused by stress in the aluminum layer.

DETAILED DESCRIPTION OF THE EMBODIMENTS

An exemplary embodiment of the present invention will hereinafter be described in detail with reference to the accompanying drawings.

FIG. 2A to FIG. 2D are cross-sectional views showing principal stages of forming an aluminum contact according to an exemplary embodiment of the present invention.

Figure 1A:
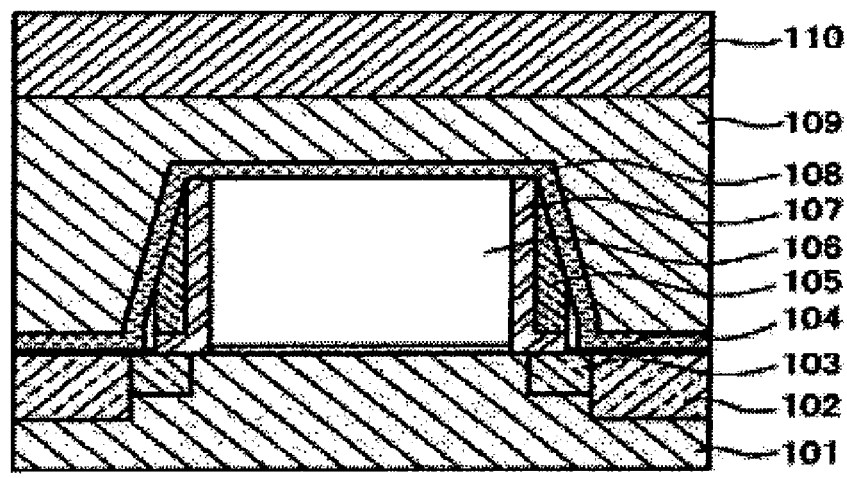
FIG. 1A and FIG. 1B are cross-sectional views showing principal stages of forming an aluminum contact according to a conventional method.
Figure 1B:
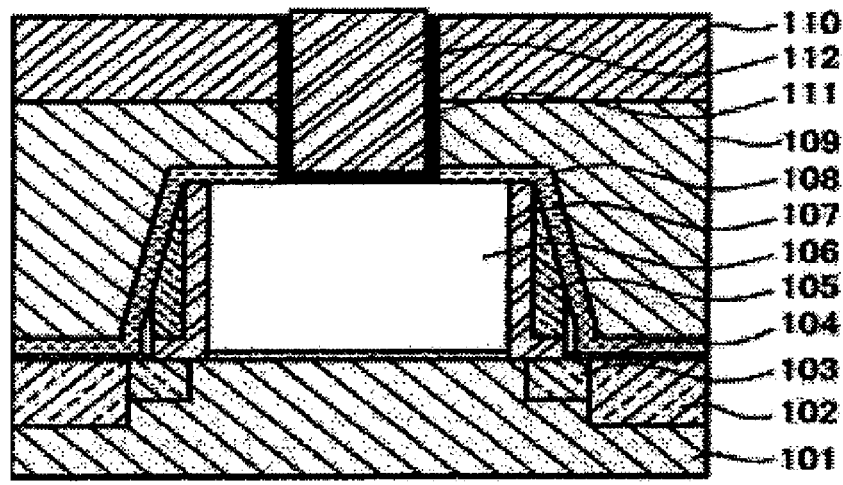
Figure 2A:
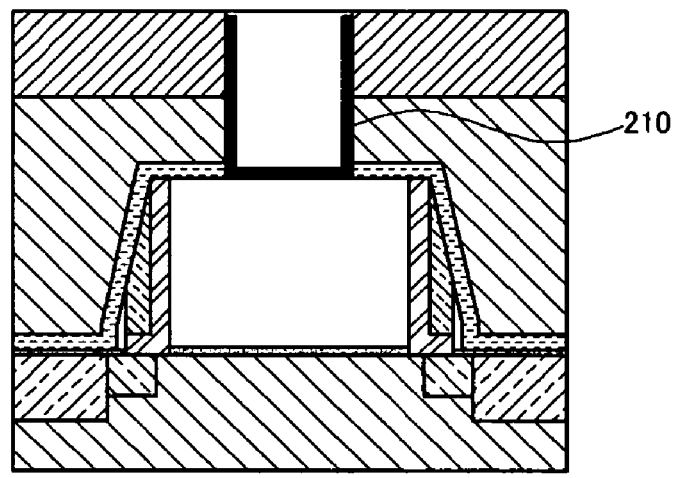
FIG. 2A to FIG. 2D are cross-sectional views showing principal stages of forming an aluminum contact according to an exemplary embodiment of the present invention.

First, as shown in FIG. 2A, a barrier metal layer 210 is formed on the interlayer insulation layer pattern defining a contact hole so as to form an aluminum layer only in a contact hole. The barrier metal layer 210 can be composed of titanium nitride (TiN), tantalum nitride (TaN), titanium aluminum nitride (TiAlN), titanium silicon nitride (TiSiN), tantalum aluminum nitride (TaAlN), tantalum silicon nitride (TaSiN), tungsten nitride (WN), or a combination thereof.

Figure 2B:
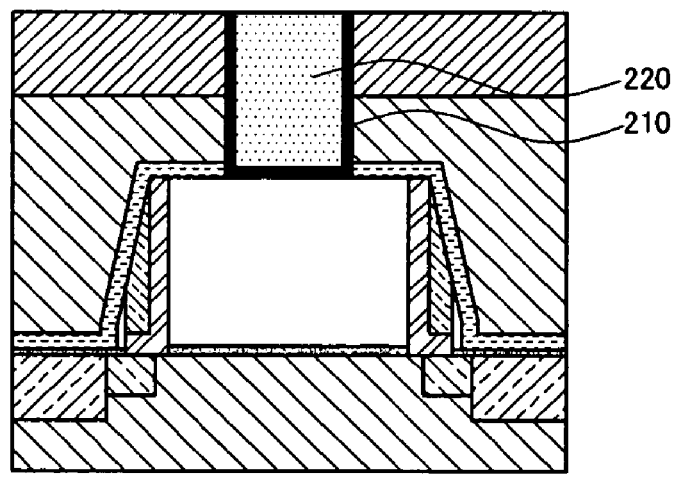

Subsequently, as shown in FIG. 2B, an aluminum layer 220 is formed on the barrier metal layer 210 by a CVD method so as to fill the contact hole. The aluminum metal layer 220 is planarized by using a chemical mechanical polishing (CMP) method.

Figure 2C:
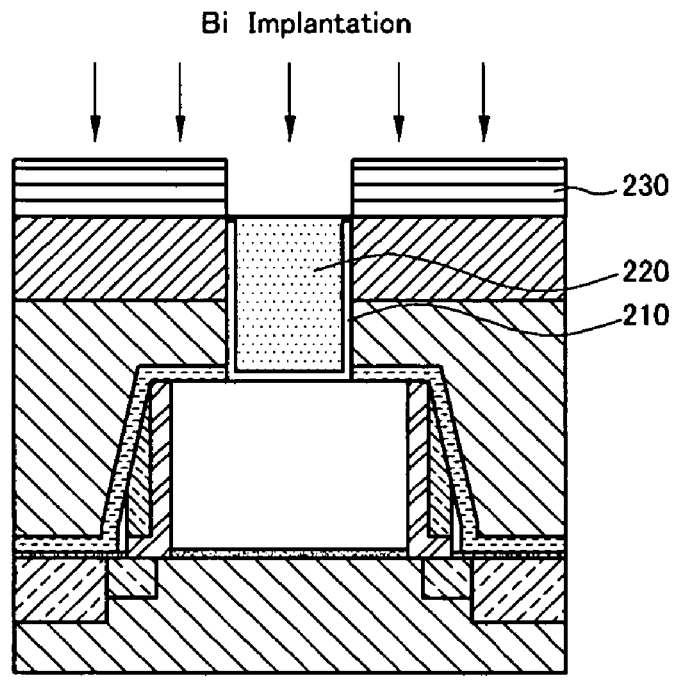

Subsequently, as shown in FIG. 2C, after forming a photoresist 230 pattern for ion implantation, Bi ions are implanted into the aluminum layer 220. The atomic weight of Bi is 209, which is heavier than that of tungsten. At this time, another heavy metal such as Pb, Pt, Re, Os, Ir, or Tl can be used for the ion implantation.

Figure 2D:
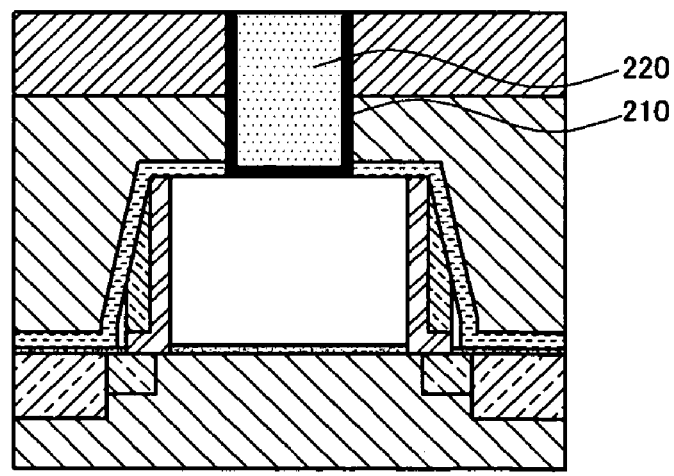

Subsequently, as shown in FIG. 2D, rapid thermal processing (RTP) recovers the implantation-damaged structure of the aluminum layer 220 and activates Bi ions to move to a stable position. As the Bi ions are activated into the aluminum layer, formation of hillocks due to stress in the aluminum layer can be suppressed.

As described above, the exemplary embodiment of the present invention includes forming a barrier metal layer, forming an aluminum layer having low resistivity by using a CVD method, implanting ions that are heavier than tungsten, and annealing by using a rapid thermal process. Consequently, a junction breakdown can be prevented by suppressing hillock formation caused by stress in the aluminum layer.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for forming an aluminum contact, comprising:
    forming a barrier metal layer on an interlayer insulation layer pattern defining a contact hole;
    forming an aluminum layer on the barrier metal layer so as to fill the contact hole;
    forming a photoresist pattern for ion implantation;
    implanting ions into the aluminum layer; and
    annealing by using a rapid thermal process.

2. The method of claim 1, wherein the baffler metal layer is composed of titanium nitride (TiN), tantalum nitride (TaN), titanium aluminum nitride (TiAlN), titanium silicon nitride (TiSiN), tantalum aluminum nitride (TaAlN), tantalum silicon nitride (TaSiN), tungsten nitride (WN), or a combination thereof.

3. The method of claim 1, wherein the aluminum layer is deposited by a chemical vapor deposition (CVD) method.

4. The method of claim 1, wherein the ions implanted into the aluminum layer are Bi, Pb, Pt, Re, Os, Ir, or Tl ions.

\* \* \* \* \*